United States Patent [19]

Kim

[11] Patent Number: 5,729,233
[45] Date of Patent: Mar. 17, 1998

[54] ANALOG/DIGITAL CONVERTER USING A CHARGE COUPLED DEVICE WITH POLY-GATES RELATIVELY SIZED

[75] Inventor: Yong Gwan Kim, Kyungki-do, Rep. of Korea

[73] Assignee: LG Semicon Co., Ltd., Chungcheongbuk-do, Rep. of Korea

[21] Appl. No.: 532,100

[22] Filed: Sep. 22, 1995

[51] Int. Cl.⁶ ............................................. H03M 1/38
[52] U.S. Cl. ........................... 341/172; 341/159; 341/162
[58] Field of Search ................................. 341/172, 159, 341/162

[56] References Cited

U.S. PATENT DOCUMENTS

| | | | |
|---|---|---|---|
| 4,099,175 | 7/1978 | Rubin | 340/347 |
| 4,115,766 | 9/1978 | Smith | 340/347 |
| 4,306,221 | 12/1981 | Jiang | 340/347 |
| 5,010,340 | 4/1991 | Green | 341/172 |
| 5,406,101 | 4/1995 | Park | 257/249 |
| 5,519,749 | 5/1996 | Lee | 377/58 |

*Primary Examiner*—Jeffrey A. Gaffin
*Assistant Examiner*—Jason H. Vick
*Attorney, Agent, or Firm*—Finnegan, Henderson, Farabow, Garrett & Dunner, L.L.P.

[57] ABSTRACT

An analog-to-digital (A/D) converter using a charge-coupled device (CCD) for converting analog data to digital data, the CCD including a plurality of gates with potential wells, the number of gates corresponding to a number of bits of the digital data, and a size of each potential well corresponding to a given significant bit and being one-half the size of the potential well corresponding to the next most significant bit. The charges of an input analog signal are transmitted to respective potential wells. A plurality of driving circuits apply a voltage to the respective potential wells and output the charges stored in the respective potential wells as digital data.

20 Claims, 5 Drawing Sheets

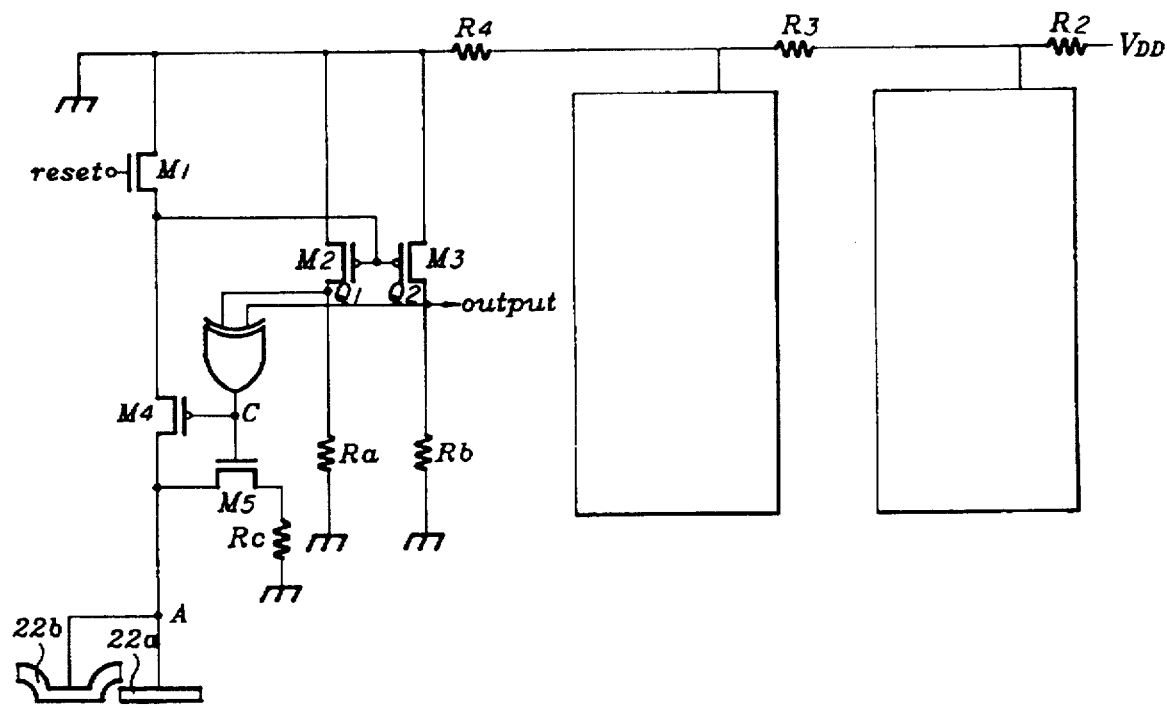

ANALOG/DIGITAL CONVERTER USING A CHARGE COUPLED DEVICE WITH POLY-GATES RELATIVELY SIZED

BACKGROUND OF THE INVENTION

1. Field of the Invention

The present invention relates to an analog-to-digital (A/D) converter, and more particularly, to an A/D converter using a charge-coupled device (CCD) for enhancing resolution and conversion speed.

2. Description of Related Art

Generally speaking, there are two types of A/D converters—integration type and comparison type. A comparison-type A/D converter is also divided into a feed-back type which is represented by a successive-comparison type, and a non-feedback type which is represented by a parallel type.

The successive-comparison type A/D converter has a built-in D/A converter, in which an input analog signal and the output of the D/A converter are compared so that the output of the D/A converter coincides with the input analog signal.

The parallel-comparison type A/D converter divides an analog signal into a number of levels based on a resolution required for digitalizing an input analog signal. A/D conversion is performed according to the divided levels.

FIG. 1a is a block diagram of the successive-comparison type A/D converter. FIG. 1b shows the parallel-comparison type A/D converter.

First, the successive-comparison type A/D converter of FIG. 1a comprises a comparator 1, control logic circuit 2, shift register 3, N-bit holding register 4, and N-bit D/A converter 5. For N bits, the conversion time is N periods of the clock.

During the first period of the clock, the value of shift register 3 is 100 ... 000(N). This value is converted into an analog signal using D/A converter 5 and compared with an input analog signal by comparator 1. Through this operation, a HIGH or LOW value is obtained.

If the output of comparator 1 is HIGH, the most significant bit (MSB) of holding register 4 is stored as HIGH. If LOW, the MSB of the holding register is stored as LOW. Here, when the output of comparator 1 is HIGH, the value of shift register 3 is 100 ... 000. If LOW, the value of the shift register is 010 ... 000.

During the second period of clock, the value of shift register 3 is converted into an analog signal through D/A converter 5 and compared with the input analog signal by comparator 1. If the output of comparator 1 is HIGH, the second highest bit of holding register 4 is stored as HIGH. If LOW, the second highest bit of holding register 4 is stored as LOW. Here, the value of shift register 3 is 110 ... 000 when the output of comparator 1 is HIGH. When the output of the comparator is LOW, the value of the shift register is 001 ... 000.

In an N-bit A/D converter, the above operation is repeated N times in order to obtain an N-bit digital signal value.

The parallel-comparison A/D converter of FIG. 1b comprises n resistors $R_1, R_2, \ldots R_n$ for dividing an input power voltage $V_{cc}$, latching comparators 7 and AND gates 8 for comparing the analog input signal and the divided voltages, and a decoder 9 for decoding the output signals of latching comparators 7 and AND gates 8.

In this parallel-comparison type A/D converter, during the first half of the first period of the clock, the analog input signal is input to latching comparators 7, and the compared result is stored therein. For the remaining half of the first period of the clock, the stored data is output through decoder 9.

Conventional A/D converters have the following problems.

First, the successive-comparison type A/D converter, has a slow conversion speed and poor conversion accuracy. The parallel-comparison type A/D converter is a complicated system requiring $2^n-1$ comparators to form a converter of an N-bit resolution.

Secondly, these conventional A/D converters have a large chip area, consume a large amount of power, and must pass through an encoder.

SUMMARY OF THE INVENTION

In order to solve such problems, it is an object of the present invention to provide an A/D converter using a CCD to increase the resolution and conversion speed of the A/D converter.

Additional objects and advantages of the invention will be set forth in part in the description which follows and in part will be obvious from the description, or may be learned by practice of the invention. The objects and advantages of the invention may be realized and attained by means of the instrumentalities and combinations particularly pointed out in the appended claims.

To achieve the objects and in accordance with the purpose of the invention, as embodied and broadly described herein, an analog-to-digital (A/D) converter using a charge-coupled device (CCD) for converting analog data to digital data includes n number of gates with potential wells, where n is the number of bits in the digital data and a size of a potential well corresponding to a given significant bit being one-half the size of each potential well corresponding to the size of the potential well corresponding to the next most significant bit. Charges corresponding to an input analog signal are transmitted to respective potential wells. A plurality of driving circuits apply voltages to the respective potential wells and output charges stored in the respective potential wells as digital data.

BRIEF DESCRIPTION OF THE DRAWINGS

The accompanying drawings, which are incorporated in and constitute a part of this specification illustrate embodiments of the invention and, together with the description, serve to explain the objects, advantages and principles of the invention. In the drawings.

FIG. 4 is a detailed circuit diagram of a driving circuit utilized in FIG. 3;

FIG. 5 is a table showing the potential variations at respective operation points of the driving circuit of FIG. 4.

DETAILED DESCRIPTION OF THE INVENTION

Figure 1A:
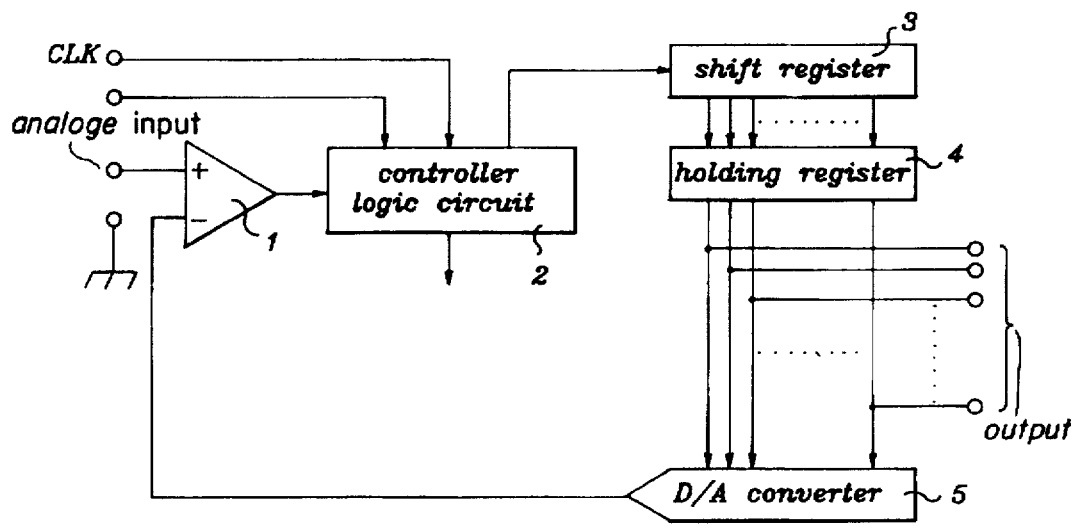
FIG. 1a is a block diagram of a conventional successive-comparison type A/D converter.
Figure 1B:
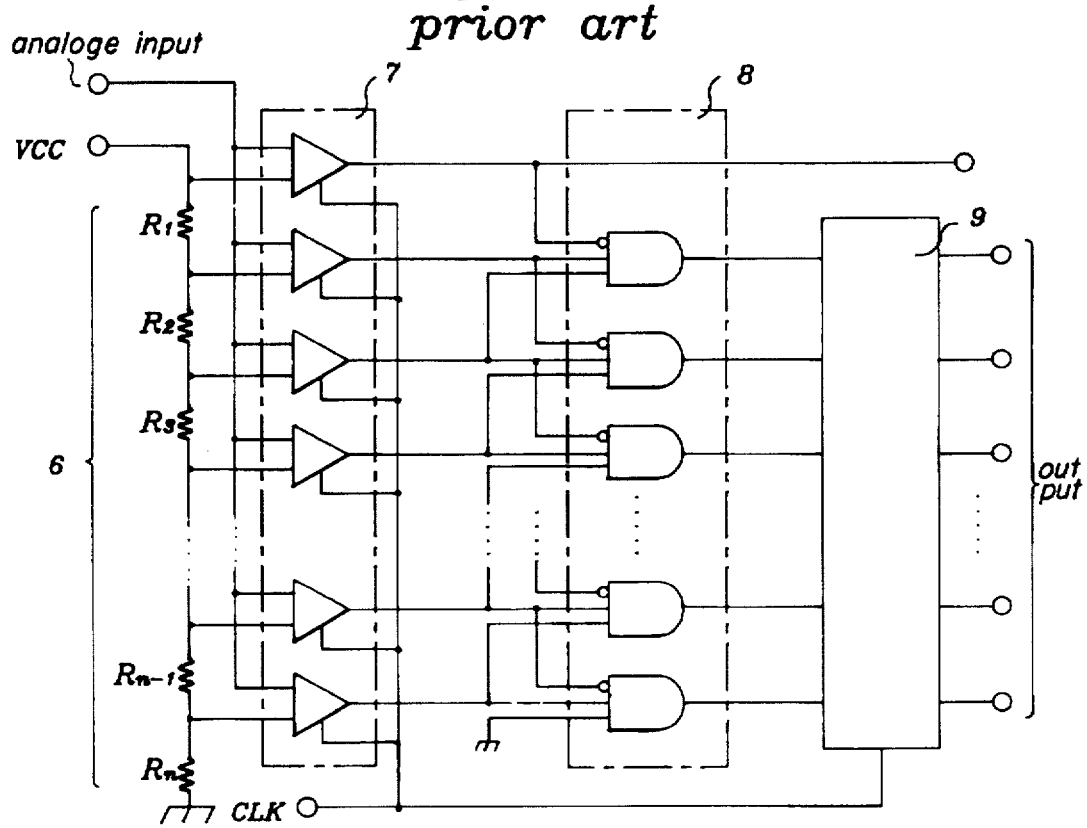
FIG. 1b is a circuit diagram of a conventional parallel comparison type A/D converter.
Figure 2:
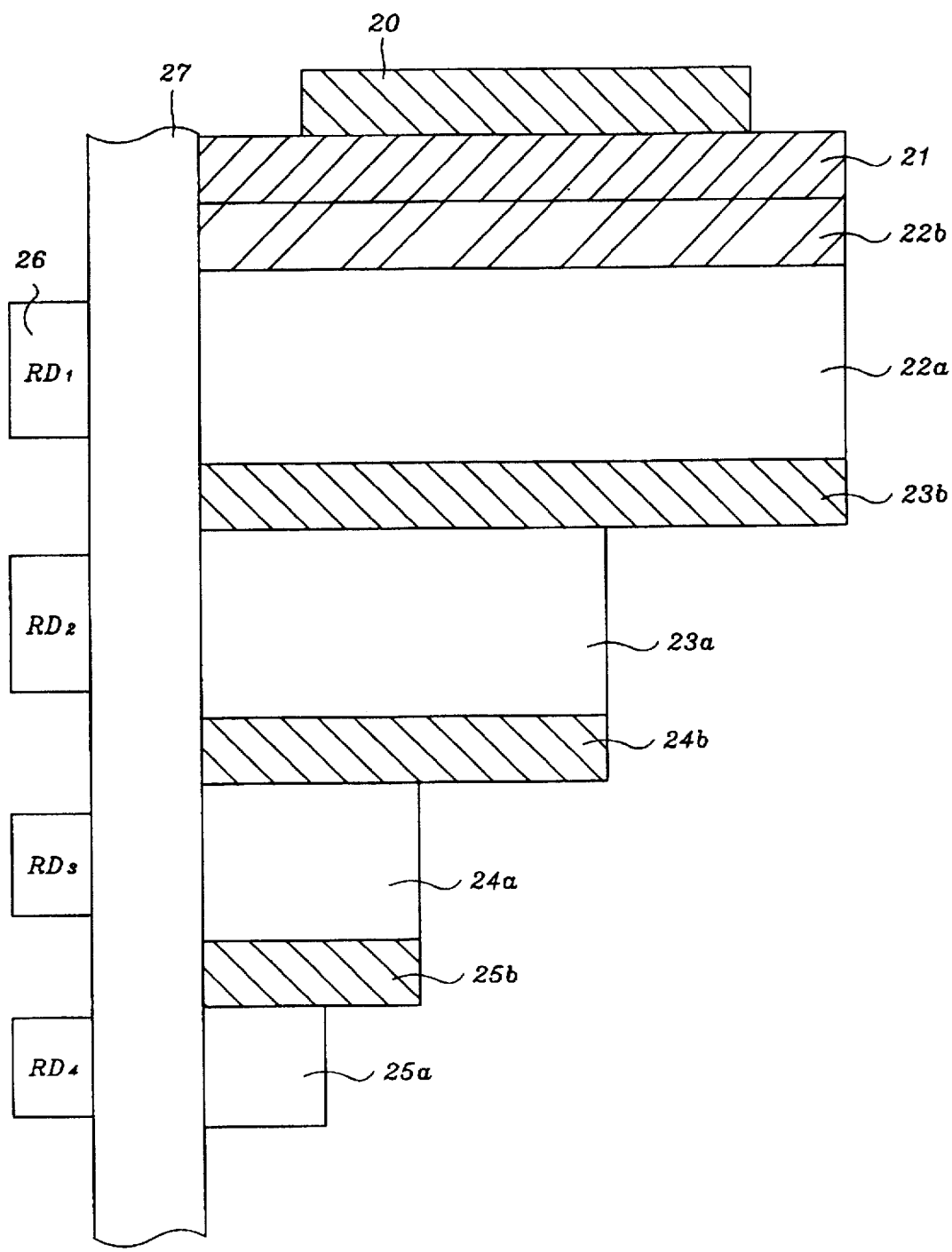
FIG. 2 is a layout of a CCD constituting an A/D converter according to a preferred embodiment of the present invention.
Figure 3:
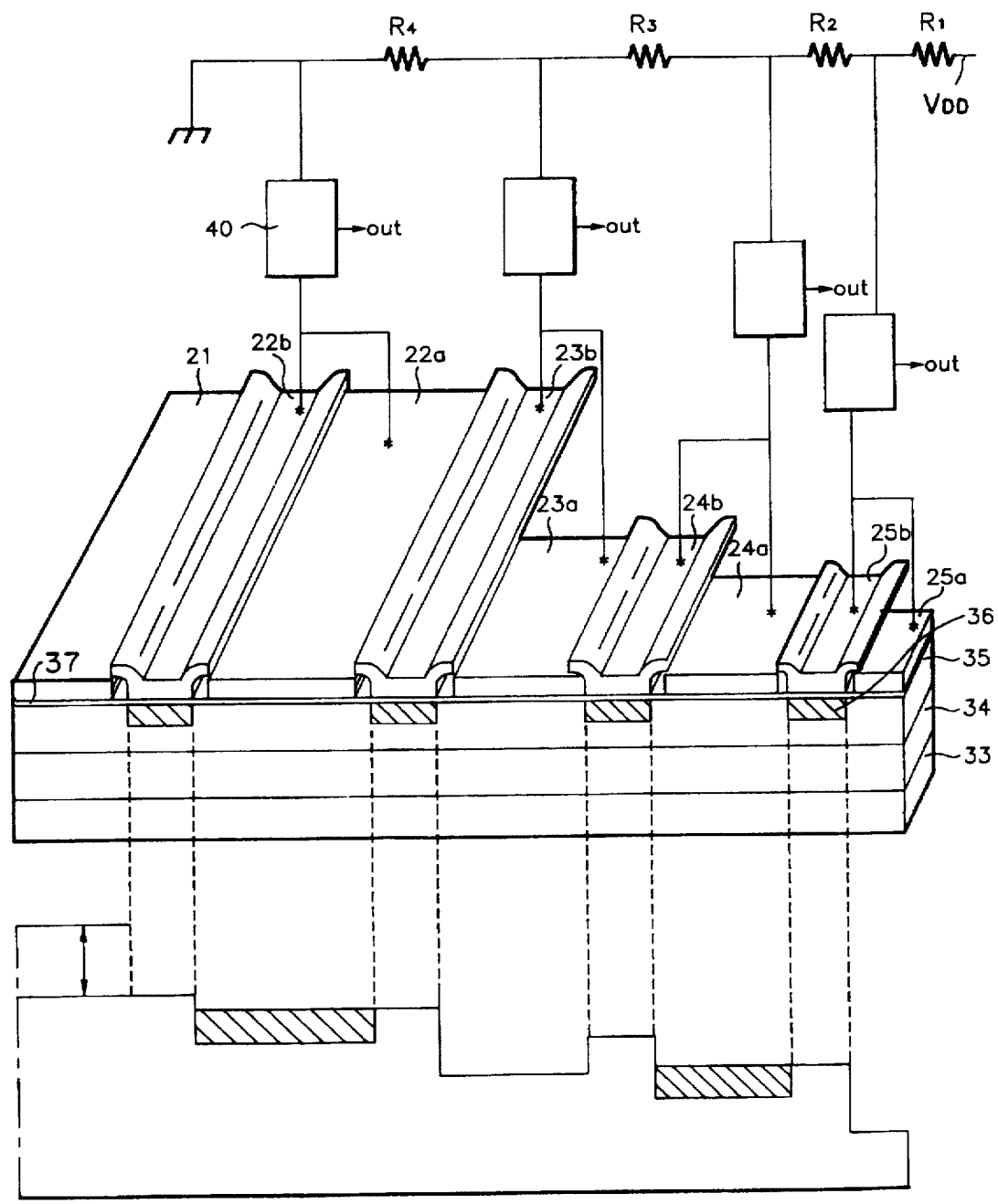
FIG. 3 is a perspective view for showing the vertical structure, a potential profile, and a block diagram of the driving circuit of the A/D converter of the present invention.

Referring to FIGS. 2, 3 and 4, in order to form an A/D converter according to the present invention, a CCD must be constructed so that the size of a potential well corresponding to the most significant bit (MSB) is twice as large as the size of a potential well corresponding to the next significant bit. By this construction the ciphers of respective bits are determined. Therefore, the size of the potential well through which the least significant bit (LSB) is output can be represented by $2^0$. The size of the potential well through which the MSB is output can be represented by $2^{n-1}$.

As shown in FIG. 2, the layout of the CCD comprises a charge supply area 20 formed on one side of a buried charge coupled device (BCCD) area for storing and supplying charges of a predetermined level. An analog signal input gate area 21 is formed near one side of charge supply area 20 for adjusting the variation range of potential levels according to the magnitude of an input analog signal so that the charges of charge supply area 20 are input to the potential wells designating the ciphers of the respective bits. First poly-gate areas 22a, 23a, 24a and 25a are formed at predetermined intervals on one side of the analog signal input gate area 21. Each successive first poly-gate area has an area that is half the area of the previous first poly-gate area. This results in different sized potential wells. The second poly-gate areas 22b, 23b, 24b and 25b are formed repeatedly between the first poly-gate areas 22a, 23a, 24a and 25a, for discriminating the potential wells formed by first poly-gate areas 22a, 23a, 24a and 25a. Reset gate area 27 and reset drain areas 26 are commonly formed on one side of the first and second poly-gate areas so as to discharge charges after A/D conversion/detection.

FIGS. 2 and 3 show a four-bit A/D converter. The first area 22a of the first poly-gate areas is the MSB of a digital conversion code and the fourth area 25a of the first poly-gate areas is the LSB of the digital conversion code. An analog signal is input to the input gate area 21.

As shown in FIG. 3, the CCD includes a second-conductivity (p) type well area 34 that is formed by implanting second-conductivity (p) impurity ions on a first conductivity (n) type semiconductor substrate 33. A BCCD area 35 is formed by implanting high-concentration first-conductivity (n) type impurity ions into second-conductivity well area 34. A potential barrier 36 is formed under a gate electrode for partitioning analog signal input gate area 21 from BCCD area 35 and the respective bits. A gate insulating layer 37 is formed on the substrate above BCCD area 35. The electrodes corresponding to the second poly-gate area 22b, 23b, and 24b, are formed on the gate insulating layer 37 and correspond to the number of bits mentioned in FIG. 2. The electrodes corresponding to the first poly-gate areas 22a, 23a, 24a and 25a are formed on gate insulating layer 37.

The CCD shown in FIG. 3 further includes a plurality of resistors R1–Rn formed between a power voltage terminal and a ground terminal for dividing the power voltage $V_{DD}$. A plurality of driving circuits 40 for driving the first and second poly-gate areas are coupled between one of the resistors $R_1$, $R_2$, $R_3$, and $R_4$, and the gates of the first poly-gate areas 22a, 23a, 24a and 25a, and the second poly-gate areas 22b, 23b, 24b and 25b. The driving circuits 40 transmit the charges input from charge supply area 20 by analog signal input gate area 21 to first poly-gate areas 22a, 23a, 24a and 25a, and detect whether the potential wells of the first poly-gate areas 22a, 23a, 24a and 25a are fully charged before outputting either a bit value of "0" or "1".

Referring to FIG. 4, the driving circuits 40 include a first MOS transistor M1 for switching between power voltage $V_{DD}$ divided through the resistors $R_2$, $R_3$ and $R_4$, and a reset signal, second and third MOS transistors M2 and M3 switch between power voltage $V_{DD}$ divided through the resistors and the output of the first MOS transistor M1. Resistors Ra and Rb ground the output of second and third MOS transistors M2 and M3, and an EXCLUSIVE-OR gate 45 performs an EXCLUSIVE-OR operation on the output of the second and third MOS transistors M2 and M3. The signal output by the EXCLUSIVE-OR gate 45 switches a fourth MOS transistor M4 between applying the output of the first MOS transistor M1 to associated first and second poly-gate areas 22a and 22b, and applying the signal of the charges stored in the potential well of first poly-gate area 22a to second and third MOS transistors M2 and M3. A fifth MOS transistor M5 and a resistor Rc ground the voltage of first and second poly-gate areas 22a and 22b based upon the output signal of EXCLUSIVE-OR gate 45.

Here, first and fifth transistors M1 and M5 are N-type. Second, third and fourth transistors M2, M3 and 40 are P-type. Second and third MOS transistors M2 and M3 have different threshold voltages. The output of third MOS transistor M3 is the signal output of the digital bit for the corresponding poly-gate area. The blank boxes shown in FIG. 3 represent the multiple driving circuits.

Figure 6:
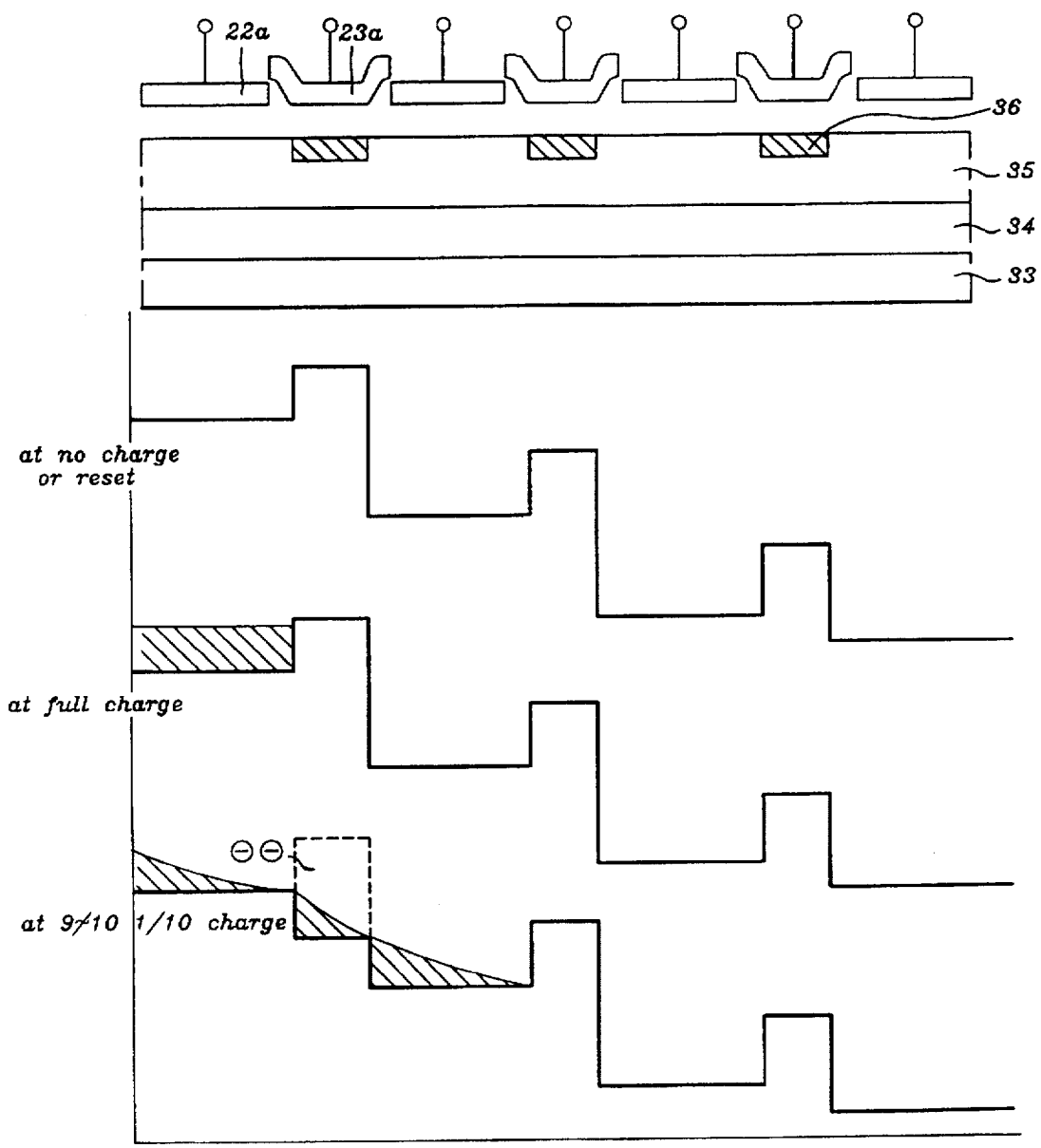
FIG. 6 is a potential profile showing the potential variations in accordance with the respective operations of the A/D converter of the present invention.

Referring to FIGS. 5 and 6, after the reset signal is input to the driving circuit, the potential level at the poly-gate area is varied. When the reset signal is applied to the first MOS transistor M1 of a driving circuit 40, the first MOS transistor M1 is turned on and second and third MOS transistors M2 and M3 are turned off so that the output C of EXCLUSIVE-OR gate 45 is LOW. Thus fourth MOS transistor M4 is turned on so that the output voltage of the first MOS transistor M1 is applied to first areas 22a and 22b of the first and second poly-gate areas. Since the reset signal is applied instantly, first MOS transistor M1 is turned on instantly so that its output port is charged up, and this voltage is applied to the respective areas of the first and second poly-gate areas.

According to this principle, different static voltages VDD divided by the resistors $R_1$, $R_2$ and $R_3$ are applied to respective areas 23a, 23b, 24a, 24b, 25a and 25b of the first and second poly-gate areas resulting in the potential becoming lower as bit significance decreases. Since the potential becomes lower as the bit significance decreases, the charges input through analog signal input gate area 21 are filled sequentially from the MSB to the LSB.

When the charges are transmitted and filled in the respective areas, the operation of the driving circuits 40 is as depicted in FIG. 5, whether the charges are filled fully in a corresponding area or not. When the charges are filled fully in a corresponding potential well area, the voltage at point A (FIG. 4) drops to LOW ($V_{DD}$–1) so that second, third and fourth MOS transistors M2, M3 and M4 are turned on and fifth MOS transistor M5 is turned off.

After the reset signal is applied and before the charges are filled in the corresponding area, the voltage at point A lies at voltage H/2 between HIGH and LOW so that second MOS transistor M2 is turned on, third and fourth MOS transistors M3 and M4 are turned off, and fifth MOS transistor M5 is turned on. This increases the potential at a potential well area so that the charges stored in a corresponding first poly-gate area are transmitted to the next area.

The output of third MOS transistor M3 becomes the output value of a corresponding bit. When the charges are filled fully, HIGH signal (1) is the output value. When not, LOW signal (0) is the output value.

The A/D conversion operation of the present invention will be described below.

Given that the amount of the charges input according to the input analog signal is "10", the size of the potential well of the first area 22a of the first poly-gate area may be considered as "8", the size of the potential well of the second area 23a of the first poly-gate area as "4", the size of the potential well of the third area 24a of the first poly-gate area as "2", and the size of the potential well of the fourth area 25a of the first poly-gate area as "1". The charges corresponding to size "8" are filled in the potential well of the first area 22a of the first poly-gate area. The charges corresponding to size "2" are filled into the potential well of the second area 23a of the first poly-gate area because the potential profile is stair-shaped due to the difference of voltages applied to the respective first poly-gate areas 22a, 23a, 24a and 25a.

The first area 22a of the first poly-gate area is filled fully with charges. However, since the size of the potential well of the second area 23a of the first poly-gate area is "4" and the amount of charges input thereto is "2", the charges are not filled fully in the potential well of the second area 23a of the first poly-gate area.

As described with reference to FIGS. 4 and 5, in the driving circuit corresponding to the first area 22a of the first poly-gate area, HIGH signal (1) is output from third MOS transistor M3, and LOW signal (0) is output from third MOS transistor M3 of the second area 23b of the first poly-gate area. At the same time, as the fifth MOS transistor M5 is turned on, the potential of the potential well of the second areas 23a and 23b of the first and second poly-gate areas is raised so that the charges stored in the potential well of the second area 23a of the first poly-gate area are transmitted to third area 24a of the first poly-gate area.

The driving circuit outputs a HIGH signal (1) when the charges transmitted to the third area 24a of the first poly-gate area fully fill the potential well of the third area 24a of the first poly-gate area which has a size of "2".

Through this operation, the analog signal corresponding to the charges of size "10" is converted into a digital signal of 1010.

FIG. 6 shows the potentials for cases in which the charges are fully filled, partially filled, and empty. After signal conversion, a HIGH signal is applied to reset gate area 27 to lower the potential level of reset gate area 27 (FIG. 2), the charges stored in first poly-gate areas 22a, 23a, 24a and 25a are discharged to the corresponding reset drain areas 26.

The A/D converter using a CCD of the present invention is advantageous in that the circuitry configuration of the A/D converter may be placed on the same chip as that of the CCD, providing a simplified structure. The conversion of video signals to analog signals and then to digital signals is performed at the same time to allow the system to be constructed efficiently. Further, there is no need of an encoder to increase resolution and conversion speed.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. An analog-to-digital (A/D) converter using a charge-coupled device (CCD) for converting analog data to digital data, the CCD comprising:

a plurality of gates each having a potential well, a number of gates corresponding to a number of bits of the digital data (n), and a size of each potential well corresponding to a given significant bit and being one-half the size of the potential well corresponding to the next most significant bit;

a buried charge coupled device (BCCD) area under said plurality of gates for transmitting charges of the analog signal to respective potential wells; and, a plurality of driving circuits corresponding to said plurality of gates for applying a voltage to the respective potential wells and for outputting the charges stored in the respective potential wells as digital data, wherein each one of the plurality of gates is connected to a different one of the plurality of driving circuits.

2. An analog-to-digital (A/D) converter using a charge-coupled device (CCD) for converting analog data to digital data, the CCD comprising:

a charge supply area for storing and outputting charges;

a plurality of poly-gate areas formed at predetermined intervals, each successive poly-gate area being one-half of a previous poly-gate area, such as to form different-sized potential wells;

an analog signal input gate area, provided between the plurality of poly-gate areas and the charge supply area, for inputting the charges of said charge supply area to the potential wells, thereby designating values of the respective bits of the digital data according to a magnitude of the analog signal, the analog signal input gate area including a buried charge coupled device area under the plurality of poly-gate areas for transferring charges in the charge supply area to the potential wells;

a reset gate area and reset drain area for discharging the charges of the potential wells;

a voltage dividing portion for dividing a supply voltage into a plurality of voltages; and a plurality of driving circuits for supplying the divided voltages to said poly-gate areas so that the potentials of the respective potential wells are decreased for lower bits of the digital data, and for detecting the amount of charges input to the respective potential wells and outputting a corresponding value for the digital data, wherein each one of the plurality of driving circuits is connected to a different one of the poly-gate areas.

3. The CCD as claimed in claim 1, further comprising:

a second-conductivity type well formed on a first conductivity type semiconductor substrate, said buried charge coupled device (BCCD) area being formed in said second-conductivity well;

a charge supply area formed on one side of said BCCD area;

an analog signal input gate area formed on one side of said charge supply area and on said BCCD area and for varying a potential level according to the analog signal;

a plurality of first poly-gate areas formed on one side of said analog signal input gate area and on said BCCD at predetermined intervals, each successive first poly-gate area being one-half of a previous first poly-gate area;

a plurality of second poly-gate areas respectively formed adjacent to each one of said first poly-gate areas;

a reset gate area formed on one side of said first and second poly-gate areas; and a reset drain area formed on one side of said reset gate area.

4. The CCD as claimed in claim 3, wherein a potential barrier is formed on said BCCD area underlying said second poly-gate areas.

5. The CCD as claimed in claim 3, further comprising a plurality of reset drain areas formed opposite said first poly-gate areas.

6. The CCD as claimed in claim 3, wherein said plurality of second poly-gate areas are formed between said analog signal input gate area and the first poly-gate areas.

7. The CCD as claimed in claim 2, wherein said driving circuits detect amounts of the charges input to the respective potential wells, when the charge completely fills one of the potential wells, a digital value of 1 is output, and a digital value of 0 is output when the charge stored in one of the potential wells does not fill the one potential well and is transferred to a next adjacent potential well.

8. An analog-to-digital (A/D) converter using a charge-coupled device (CCD) for converting analog data to digital data, the CCD comprising:

a charge supply area for storing and outputting charges;

a plurality of poly-gate areas formed at predetermined intervals, each successive poly-gate area being one-half of a previous poly-gate area, such as to form different-sized potential wells;

an analog signal input gate area, provided between the plurality of poly-gate areas and the charge supply area, for inputting the charges of said charge supply area to the potential wells, thereby designating values of the respective bits of the digital data according to a magnitude of the analog signal, the analog signal input gate area including a buried charge coupled device area under the plurality of poly-gate areas for transferring charges in the charge supply area to the potential wells;

a reset gate area and reset drain area for discharging the charges of the potential wells;

a voltage dividing portion for dividing a supply voltage into a plurality of voltages; and a plurality of driving circuits for supplying the divided voltages to said poly-gate areas so that the potentials of the respective potential wells are decreased for lower bits of the digital data, and for detecting the amount of charges input to the respective potential wells and outputting a corresponding value for the digital data, wherein each of said driving circuits comprises:

a first transistor for switching between one of said divided voltages and a reset voltage;

second and third transistors for switching between said one divided voltage and an output of said first transistor;

a logic gate for performing a logic operation on outputs of said second and third transistors;

a fourth transistor, responsive to an output signal of the logic gate, for switching between applying the output of said first transistor to one of the first poly-gate areas, and applying a voltage corresponding to the charges stored in the potential well of said one first poly-gate area to said second and third transistors; and a fifth transistor, responsive to the output signal of the logic gate, for connecting the one first poly-gate area to ground.

9. The CCD as claimed in claim 8, wherein said first and fifth transistors are N-type, and said second, third and fourth transistors are P-type.

10. The CCD as claimed in claim 8, wherein said second and third transistors have different threshold voltages.

11. The CCD as claimed in claim 9, wherein said second and third transistors have different threshold voltages.

12. The CCD as claimed in claim 8, wherein the output of said third transistor is a digital value of a corresponding bit.

13. The CCD as claimed in claim 9, wherein the output of said third transistor is a digital value of a corresponding bit.

14. The CCD as claimed in claim 8, wherein the outputs of said second, third and fourth transistors are referenced to ground through resistors.

15. The CCD as claimed in claim 9, wherein the outputs of said second, third and fourth transistors are referenced to ground through resistors.

16. An analog-to-digital (A/D) converter using a charge-coupled device (CCD) for converting analog data to digital data, the CCD comprising:

a charge supply area for storing and outputting charges;

a plurality of poly-gate areas formed at predetermined intervals, each successive poly-gate area being one-half of a previous poly-gate area, thereby forming different-sized potential wells;

an analog signal input gate area, provided between the plurality of poly-gate areas and the charge supply area, for inputting the charges of said charge supply area to the potential wells, thereby designating values of the respective bits of the digital data according to a magnitude of the analog signal, the analog signal input gate area including a buried charge coupled device area under the plurality of poly-gate areas for transferring charges in the charge supply area to the potential wells;

a reset gate area and reset drain area for discharging the charges of the potential wells;

a voltage dividing portion for dividing a supply voltage into a plurality of voltages;

a first transistor for switching between one of said plurality of voltages and a reset voltage;

second and third transistors for switching between said one of said plurality of voltages and an output of said first transistor;

a logic gate for performing a logical operation on outputs of said second and third transistors;

a fourth transistor, responsive to an output signal of the logic gate, for switching between applying the output of said first transistor to one of the first poly-gate areas, and applying a voltage corresponding to the charges stored in the potential well of said one first poly-gate area to said second and third transistors; and, a fifth transistor, responsive to the output signal of the logic gate, for connecting the one first poly-gate area to ground.

17. The CCD as claimed in claim 16, wherein said first and fifth transistors are N-type, and said second, third and fourth transistors are P-type.

18. The CCD as claimed in claim 16, wherein said second and third transistors have different threshold voltages.

19. The CCD as claimed in claim 16, wherein the output of said third transistor is a digital value of a corresponding bit.

20. The CCD as claimed in claim 16, wherein the outputs of said second, third and fourth transistors are referenced to ground through resistors.

* * * * *